(12) United States Patent
Jackson et al.

(10) Patent No.: US 6,812,786 B2
(45) Date of Patent: Nov. 2, 2004

(54) ZERO-BIAS BYPASS SWITCHING CIRCUIT USING MISMATCHED 90 DEGREES HYBRID

(75) Inventors: Donald G. Jackson, Garland, TX (US); Russell Hoppenstein, Richardson, TX (US)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/403,779

(22) Filed: Mar. 31, 2003

(65) Prior Publication Data
US 2003/0193369 A1 Oct. 16, 2003

Related U.S. Application Data

(63) Continuation-in-part of application No. 10/120,750, filed on Apr. 11, 2002.

(51) Int. Cl.[7] ............................................. H03F 1/14
(52) U.S. Cl. ......................................... 330/51; 330/124 D
(58) Field of Search ............................ 330/51, 9, 151, 330/124 D; 327/124

(56) References Cited

U.S. PATENT DOCUMENTS

| | | | |
|---|---|---|---|
| 4,291,277 A | 9/1981 | Davis et al. | 330/149 |
| 4,967,164 A | 10/1990 | Sari | 330/149 |
| 5,105,445 A | 4/1992 | Karam et al. | 375/60 |
| 5,105,446 A | 4/1992 | Ravoalavoson et al. | 375/60 |
| 5,107,520 A | 4/1992 | Karam et al. | 375/60 |
| 5,113,414 A | 5/1992 | Karam et al. | 375/60 |
| 5,148,448 A | 9/1992 | Karam et al. | 375/60 |
| 5,155,448 A | 10/1992 | Powell | 330/149 |
| 5,157,346 A | 10/1992 | Powell et al. | 330/151 |
| 5,323,119 A | 6/1994 | Powell et al. | 330/151 |
| 5,386,198 A | 1/1995 | Ripstrand et al. | 330/52 |
| 5,444,418 A | 8/1995 | Mitzlaff | 330/52 |
| 5,491,454 A | 2/1996 | Matz | 330/149 |
| 5,508,657 A | 4/1996 | Behan | 330/151 |
| 5,524,286 A | 6/1996 | Chiesa et al. | 455/126 |
| 5,528,196 A | 6/1996 | Baskin et al. | 330/151 |
| 5,570,063 A | 10/1996 | Eisenberg | 330/149 |
| 5,589,797 A | 12/1996 | Gans et al. | 330/149 |
| 5,598,436 A | 1/1997 | Brajal et al. | 375/297 |
| 5,619,168 A | 4/1997 | Myer | 330/149 |
| 5,621,354 A | 4/1997 | Mitzlaff | 330/52 |
| 5,644,268 A | 7/1997 | Hang | 330/151 |
| 5,732,333 A | 3/1998 | Cox et al. | 455/126 |
| 5,742,201 A | 4/1998 | Eisenberg et al. | 330/2 |
| 5,745,006 A | 4/1998 | Budnik et al. | 330/149 |
| 5,748,678 A | 5/1998 | Valentine et al. | 375/297 |
| 5,757,231 A | 5/1998 | Tozawa | 330/151 |
| 5,760,646 A | 6/1998 | Belcher et al. | 330/149 |
| 5,789,927 A | 8/1998 | Belcher | 324/622 |
| 5,796,304 A | 8/1998 | Gentzler | 330/52 |
| 5,808,512 A | 9/1998 | Bainvoll et al. | 330/151 |
| 5,867,064 A | 2/1999 | Van Horn et al. | 330/149 |
| 5,872,814 A | 2/1999 | McMeekin | 375/295 |
| 5,877,653 A | 3/1999 | Kim et al. | 330/149 |
| 5,892,397 A | 4/1999 | Belcher et al. | 330/149 |
| 5,898,338 A | 4/1999 | Proctor et al. | 330/149 |
| 5,898,906 A | 4/1999 | Williams | 455/75 |
| 5,903,611 A | 5/1999 | Schnabl et al. | 375/297 |
| 5,905,760 A | 5/1999 | Schnabl et al. | 375/296 |
| 5,917,375 A | 6/1999 | Lisco et al. | 330/151 |
| 5,929,703 A | 7/1999 | Sehier et al. | 330/149 |
| 5,929,704 A | 7/1999 | Proctor, Jr. et al. | 330/149 |
| 5,937,011 A | 8/1999 | Carney et al. | 375/297 |

(List continued on next page.)

Primary Examiner—Henry Choe
(74) Attorney, Agent, or Firm—Wood, Herron & Evans, LLP

(57) ABSTRACT

A zero-bias bypass apparatus for a low noise amplifier includes a bypass circuit, and a switching circuit coupled with a low noise amplifier and with the bypass circuit. The switching circuit includes one or more solid state devices responsive to absence of a control bias for switching an RF input signal from said amplifier to the bypass circuit with a low insertion loss and high isolation.

29 Claims, 2 Drawing Sheets

U.S. PATENT DOCUMENTS

| | | | |
|---|---|---|---|
| 5,949,283 A | 9/1999 | Proctor et al. | 3330/149 |
| 5,963,090 A | 10/1999 | Fukuchi | 330/149 |
| 5,986,499 A | 11/1999 | Myer | 330/52 |
| 6,028,477 A | 2/2000 | Gentzler | 330/149 |
| 6,029,285 A | 2/2000 | Belcher et al. | 3/149 |
| 6,046,635 A | 4/2000 | Gentzler | 330/149 |
| 6,049,707 A | 4/2000 | Buer et al. | 455/314 |
| 6,052,023 A | 4/2000 | Myer | 330/2 |
| 6,057,733 A | 5/2000 | Donaldson et al. | 330/151 |
| 6,060,949 A * | 5/2000 | Kaufman et al. | 330/51 |
| 6,066,984 A | 5/2000 | Tomaru et al. | 330/149 |
| 6,069,526 A * | 5/2000 | Ballantyne | 330/51 |
| 6,075,411 A | 6/2000 | Briffa et al. | 330/149 |
| 6,078,216 A | 6/2000 | Proctor, Jr. | 330/151 |
| 6,081,156 A | 6/2000 | Choi et al. | 330/52 |
| 6,081,160 A | 6/2000 | Custer et al. | 330/286 |
| 6,104,241 A | 8/2000 | Cova et al. | 330/149 |
| 6,108,385 A | 8/2000 | Worley, III | 375/295 |
| 6,118,339 A | 9/2000 | Gentzler et al. | 330/149 |
| 6,125,266 A | 9/2000 | Matero et al. | 455/126 |
| 6,127,889 A | 10/2000 | Myer | 330/149 |
| 6,140,874 A | 10/2000 | French et al. | 330/149 |
| 6,144,255 A | 11/2000 | Patel et al. | 330/151 |
| 6,362,685 B1 * | 3/2002 | Vagher | 330/124 R |

* cited by examiner

ZERO-BIAS BYPASS SWITCHING CIRCUIT USING MISMATCHED 90 DEGREES HYBRID

CROSS REFERENCE TO RELATED APPLICATIONS

This application is a Continuation-In-Part application of U.S. application Ser. No. 10/120,750, filed Apr. 11, 2002, which is incorporated herein by reference in its entirety.

FIELD OF THE INVENTION

This invention is generally directed to the function of providing an RF bypass function for tower-mounted low noise amplifiers (LNAs).

BACKGROUND OF THE INVENTION

The present invention is directed to the operation of amplifiers, such as low noise amplifiers in a tower-mounted active antenna system, such as an antenna system used in a base station for wireless communications. Generally speaking, such base stations employ a number of amplifiers, including low noise amplifiers (LNAs). In the case of active antenna systems, the LNAs are mounted on the tower adjacent to the radiating elements or antennas. On the signal receive side of such an installation, a low noise amplifier is typically employed at the tower top for improving the signal-to-noise ratio of the received signal and providing an amplified signal to other base station equipment, which may also be tower mounted, but which is more typically mounted in a base station enclosure at the base of the tower. Failure of tower-mounted equipment presents certain maintenance issues. Since access to the tower mounted equipment requires a worker to actually climb the tower, it is considered desirable to arrange for various fail-safe devices or modes of operation of the tower mounted equipment, including the LNAs.

One such fail-safe mode of operation for a tower-mounted LNA is an automatic bypass capability for bypassing the low noise amplifier (LNA) when a failure mode of the amplifier is detected. Such a failure mode in the LNA results in a significant degradation of the signal output by the LNA. A failure may occur, for example, due to the loss of DC bias current supplied to the tower mounted equipment, which might occur for a number of reasons. In cases of a defined failure mode of the LNA, the LNA may be automatically or otherwise bypassed, feeding the received signals directly from the antenna to the base station equipment, typically at the enclosure at the base of the tower. While such a bypass may degrade the signal-to-noise ratio somewhat in the absence of the amplifier, it is usually considered preferable to the signal degradation, which takes place when the amplifier is in a failure mode. Therefore, it is desirable to provide a bypass arrangement, to bypass an LNA, which is in a predefined failure mode from the absence of a DC control bias.

Currently, relatively expensive and cumbersome RF or microwave-compliant relay circuits have been used as one way to accomplish this bypass function. The switching devices or relays must meet stringent requirements to assure signal quality, including a relatively low insertion loss and relatively high isolation. In addition, a relay system is subject to the usual shortcomings of mechanical switching systems, including relatively low speed, high expense, relatively large size and susceptibility to various mechanical failure modes.

Therefore, it is desirable to bypass a failed LNA of a system in order for the system to continue functioning properly. However, it is also desirable that the bypass function be handled inexpensively and with low loss. A robust, solid-state construction is also desirable. Additionally, the design should function in the bypass mode with all DC input power removed to the mechanism.

BRIEF DESCRIPTION OF THE DRAWINGS

The accompanying drawings, which are incorporated in and constitute a part of this specification, illustrate embodiments of the invention and, together with a general description of the invention given below, serve to explain the principles of the invention.

DETAILED DESCRIPTION OF THE ILLUSTRATED EMBODIMENT

To address the objectives noted above and other objectives in the art, the invention provides a bypass capability that is low-loss, and relatively inexpensive. The solid-state design is also compact and robust.

Using PIN diodes with low "zero voltage" capacitance, a bypass switch design is possible which achieves the desired goals. Insertion loss of the switch is no more than approximately 0.5 dB total (0.25 dB for each section) in the "through" path, and the switch has at least around 25 dB isolation between alternate paths. This design has loss in the normal "through" path comparable to far more expensive relays. It is a solid-state design with no mechanical components. In another embodiment of the invention, shown in FIG. 2, a further improvement of insertion loss and isolation is realized.

Figure 1:
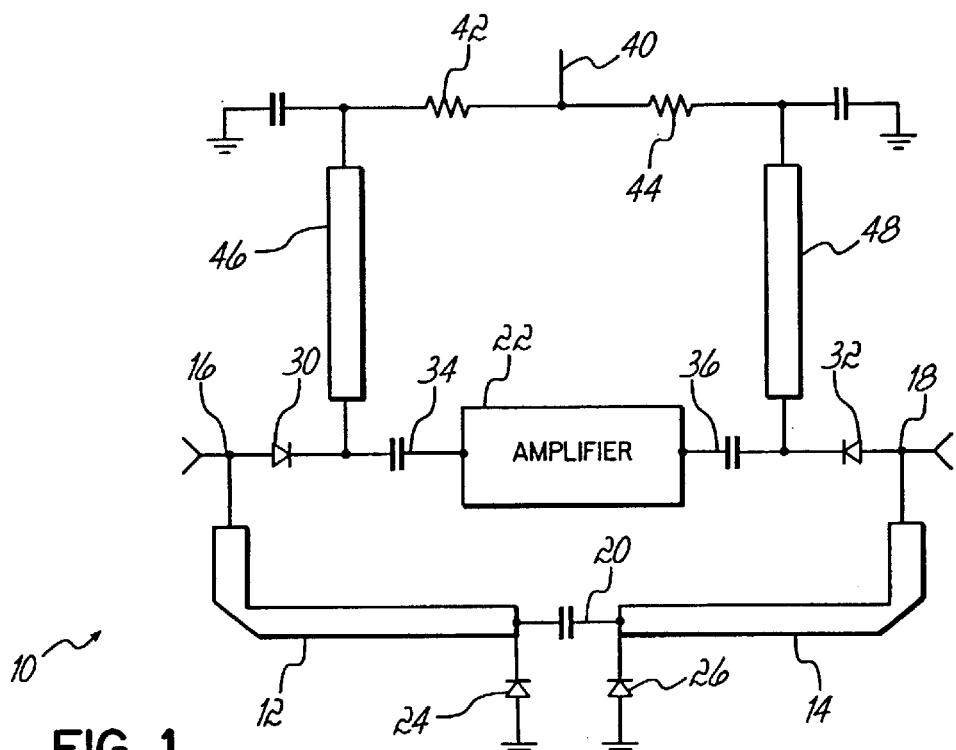
FIG. 1 is a schematic of a zero-bias bypass switching circuit in accordance with one embodiment of the invention.

Referring to FIG. 1, one embodiment of a zero-bias bypass switching circuit or switch in accordance with the invention is illustrated in circuit schematic form. In one embodiment, the switch or switching device includes a bypass circuit portion 10, which in the illustrated embodiment comprises a pair of series-coupled quarter wavelength lines 12, 14 that are coupled between an input 16 and an output 18 of the circuit. In the illustrated embodiment, the two-quarter wave lines 12 and 14 are coupled in series by a DC blocking capacitor 20.

The input 16 is coupled in series with an input of the amplifier or LNA 22, which is to be bypassed by the switching circuit or device of the invention. Similarly, the output 18 is coupled in series circuit with the output of this amplifier 22. A pair of switching diodes, 24, 26, are coupled between the ends of the respective quarter wavelength lines 12 and 14, which are coupled to the capacitor 20 and a radio frequency (RF) ground. Additional switching diodes 30 and 32 are coupled in series respectively with the input 16 and output 18 of the amplifier 22. Respective DC blocking capacitors 34, 36 are coupled respectively intermediate the diodes 30, 32 and the input and output of the amplifier 22.

A source of control bias 40 for the switching circuit is coupled by way of suitable current limiting resistors 42 and 44 and additional quarter wavelength lines 46 and 48 to respective junctions of the diodes 30 and 32 and the capacitors 34 and 36. The polarities of the connections of the diodes 24, 26, 30, and 32 are such that with the control bias 40 present or operative, all of the diodes 24, 26, 30, and 32 are biased into a conductive condition that is forward biased. The effect of this will be to deliver the input signal at the input 16 through the amplifier 22 to the output terminal 18. Conversely, when the control bias 40 is absent, the diodes 24, 26, 30, and 32 will be in a nonconductive condition, such that the signal path will flow from the input 16 through the quarter wavelength lines 12 and 14 to the output 18.

In one practical embodiment, the quarter wavelength lines 12, 14, and 46, 48 may be formed as microstrips on a suitable dielectric substrate.

Figure 2:
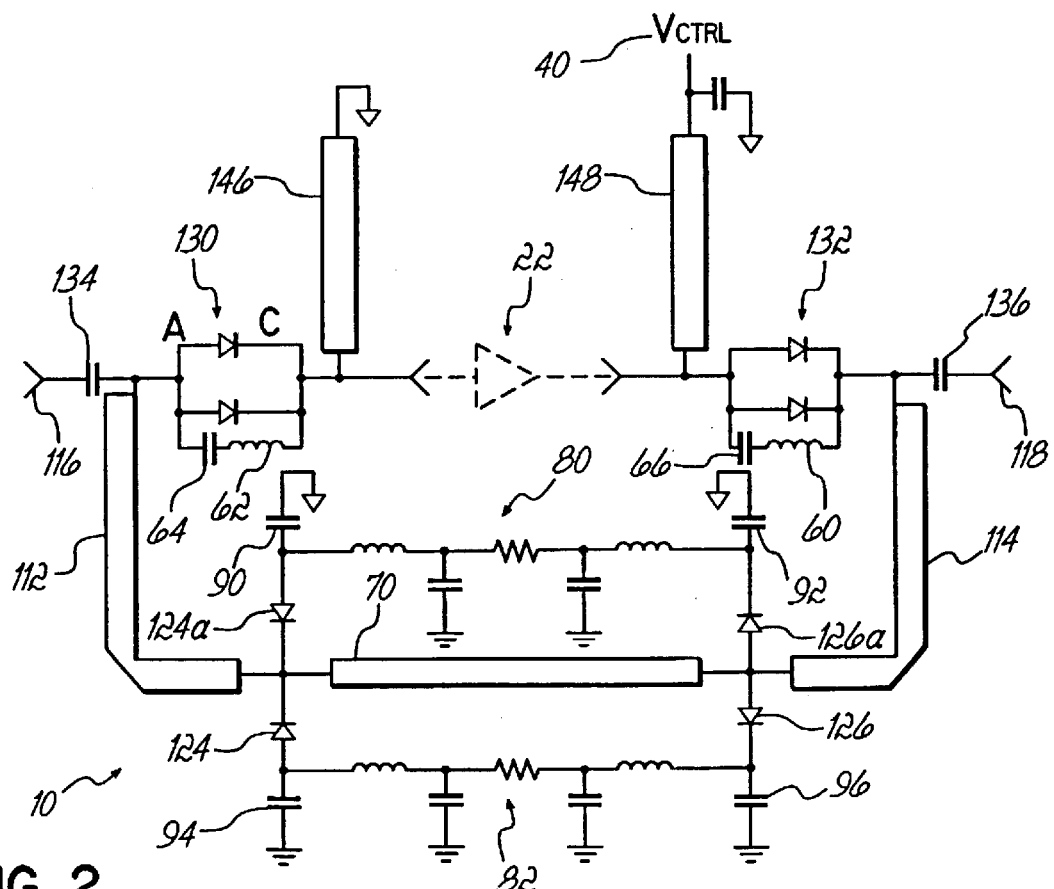
FIG. 2 is a schematic of a zero-bias bypass switching circuit in accordance with another embodiment of the invention.

While the circuit of FIG. 1 presents an operative device, better performance in terms of insertion loss and isolation can be obtained by the circuit in FIG. 2, which adds a number of resonant circuits, as well as using pairs of diodes 124, 126, 130, and 132 in parallel in place of the single diodes 24, 26, 30, and 32 of FIG. 1. In addition, in the circuit of FIG. 2, the diodes are M-Pulse Microwave P/N diodes of the type MP5X7084 from M-Pulse Microwave, San Jose, Calif., or equivalent devices. With these diode components selected in the circuit of FIG. 2, insertion loss as low as 0.15 dB and isolation as high as 60 dB is obtainable.

While the circuit of FIG. 2 is similar functionally to the circuit of FIG. 1, a number of additional components are utilized to form resonant circuits. In this regard, in the circuit of FIG. 2, the control bias voltage 40 is applied via a quarter wavelength line 148 to diodes 132 at the output side of the amplifier 22 which will be seen to be connected in reverse polarity to that shown in FIG. 1. Input diodes 130 to the amplifier 22 are coupled via a quarter wavelength line 146 to a DC ground. Both of these diode pairs 130, 132 are provided with a parallel resonant circuit comprising inductors 62, 60 and DC blocking capacitors 64, 66. The inductors 62 and 60 will resonate with the respective associated diodes 130,132 when in the off or nonconductive state; that is, they are resonant with the residual off state capacitance of the respective associated diodes 130, 132. The remaining inductors shown in FIG. 2 are chokes.

Also in FIG. 2, an additional or third quarter wavelength line 70 is provided in series between the quarter wavelength lines 112, 114, which implement a similar function as the quarter-wavelength lines 12, 14 in FIG. 1. DC blocking capacitors 134, 136 in the embodiment of FIG. 2 are coupled directly to the input 116 and output 118.

In FIG. 2, the diodes 24, 26 from FIG. 1 are replaced by respective pairs of diodes 124, 124a and 126, 126a, which are coupled with similar DC bias circuits 80, 82. The capacitors 90, 92 and 94, 96 in these resonant circuits are selected to series resonate with the diodes 124, 124a and 126, 126a in the on, or conductive state; that is, with the on state residual inductance of these diodes. The other capacitors shown in the respective circuits 80 and 82 are bypasses.

Sufficient isolation around the feedback path or leakage path provided by the bypass is important for proper operation. That is, with the LNA 22 in the circuit, feedback is to be minimized. The LNA gain is about 15 dB so the isolation must be considerably greater than 15 dB. Even at 25 to 30 dB isolation there can be amplitude and group delay "ripples" in the passband. Therefore, the goal is at least 50 dB isolation in the "normal" mode, i.e. with the LNA 22 in the path.

Diodes 24, 26 in FIG. 1 approximate a short when the LNA 22 is in the path. This cuts off the feedback through the loop. However, the quarter wave lines make this RF "short" look like an RF open circuit at the input and output ends 16, 18.

Referring to FIG. 2, the resonating inductances and capacitances are intended to minimize the diodes' ON-state impedances. While the resistive component cannot be changed, the reactance component can be cancelled out by use of the resonating elements. This also enhances the performance of the quarter wave lines and their ability to simulate an open circuit at one end when a diode is in conduction at the other end. It is desired for all of the diodes to have the lowest possible on resistance. As a practical matter, this is on the order of 1 Ohm.

Also in FIG. 2, the biasing scheme is changed from FIG. 1, such that the control bias is applied only at the output side. The polarities of the diodes are now arranged so that the bypass provides a DC bias path to the anode side of the diodes 130 as well, whose cathodes remain at a ground bias at the quarter wave line 146. The appropriate DC bias is also provided at the anodes/cathodes of the respective diodes 124, 124a, 126, 126a by the circuit shown in FIG. 2. The quarter wave lines 146 and 148 are such that the DC bias can be applied without affecting the RF performance; that is, these look like open circuits to the RF or microwave signal.

The inductances characterized as chokes are essentially AC blocks and DC shorts. Conversely, the capacitors characterized as bypasses form AC shorts and DC blocks.

The circuit of FIG. 1 will operate acceptably at relatively low frequencies, for example, on the order of 100 MHz, although the quarter wave line lengths may be inconvenient. However, in order to get the noted performance of 0.15 dB insertion loss and 60 dB isolation, when transmitting or receiving at gigahertz frequencies, the somewhat more complex circuit of FIG. 2 is utilized. It will be noted that the use of solid state components and circuitry in place of relays provides additional advantages in that the DC power requirements of the solid state devices are quite low as compared to relatively high power requirements of relays, and also there are no mechanical switching transients with the use of solid state devices, as in the embodiments of the invention shown herein. Moreover, the present cost of the solid-state circuit of FIG. 2 is on the order of ten to fifteen percent of circuits using microwave relays as the bypass switching devices.

Figure 3:
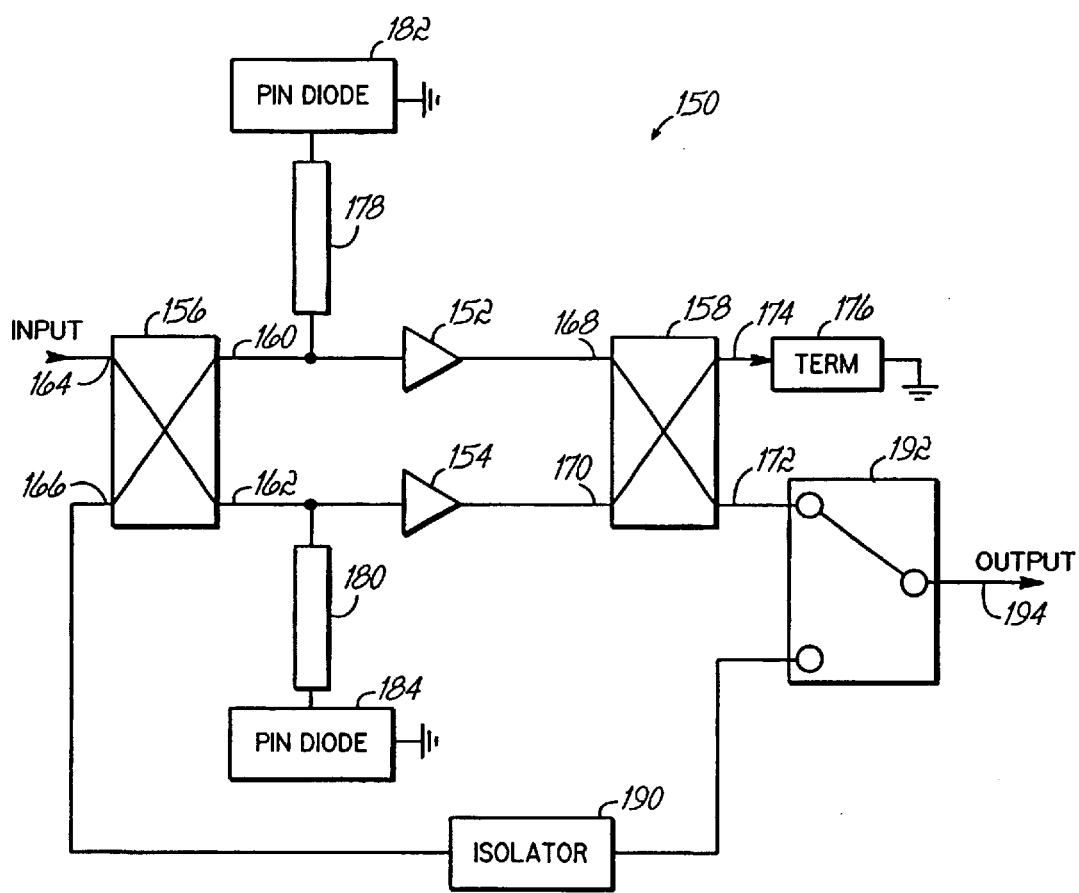
FIG. 3 is schematic of a zero-bias bypass switching circuit in accordance with another embodiment of the invention.

FIG. 3 illustrates another alternative embodiment of a bypass circuit, or switch, which may be utilized with tower-mounted LNAs to bypass the LNAs in the absence of a DC control bias, as noted above. The embodiment of FIG. 3 reduces the number of diodes, such as PIN diodes that are required for the bypass function. This is a significant improvement, as such PIN diodes are one of the more expensive components in the inventive circuit disclosed herein. For example, the embodiment illustrated in FIG. 3 utilizes only two PIN diodes in the disclosed embodiment wherein that embodiment illustrated in FIG. 2 utilizes eight PIN diodes. In addition, there are no series PIN diodes prior to the LNA device as with the embodiments seen in FIG. 1 and FIG. 3. As such, input loss with appropriate choice of PIN diodes can approach 0.05 dB.

Referring to FIG. 3, the bypass apparatus or bypass switching circuit 150 is configured for utilizing an LNA configured as a pair of individual amplifier circuits 152, 154. The inputs and outputs of the amplifier circuits 152, 154 are coupled to 90° hybrid couplers 156, 158. The operation of such hybrid couplers is known in the art, and based on the signals and impedance conditions at the various ports of the hybrid couplers. The hybrid coupler circuits 156, 158 are utilized herein as signal dividers and signal combiners, respectively. The output ports 160, 162 of the hybrid coupler circuit 156 are coupled as inputs to the amplifier circuits 152, 154, respectively. Port 164 is utilized as an RF signal input, while port 166 is utilized as an isolated bypass port, as discussed further herein below.

In the output coupler circuit 158, the ports 168, 170 are coupled to the outputs of the amplifier circuits. Coupler circuit 158 acts as a signal combiner for the outputs of the amplifier circuits 152, 154 such that the combined signal is available at the output port 172. A suitable termination circuit 176, such as a 50 Ohm load to ground, terminates the other output port 174. The coupler circuit 156 and its effective output is controlled by a switching circuit or circuits coupled to the output ports. Referring to FIG. 3, coupled to each output port 160, 162 of the coupler circuit 156, are switching circuits including respective quarter wavelength lines 178, 180 coupled to PIN diodes 182, 184. Therefore, the ends of the quarter wavelength lines opposite the output ports 160, 162 are terminated through a respective PIN diode to ground. The PIN diodes 182, 184 are coupled to a suitable control bias (not shown) for biasing them ON or to an ON state during normal operation of the amplifier circuits 152, 154, such as LNA amplifier circuits. When the diodes 182, 184 are biased ON and coupled to ground, they represent a low impedance to ground at one end of the lines 178, 180. Through the respective quarter wavelength lines 178, 180, a high impedance is presented at the output ports 160, 162 of the coupler circuit 156, hence, they have minimal impact to the transmission of the signals. Therefore, in normal operation with a control bias, an input signal at port 164 is divided and applied to the amplifier circuits 152 and 154. The outputs of the amplifier circuits are then combined through hybrid coupler circuit 158 and delivered as an output signal at port 172.

In a bypass operation, wherein the control bias is no longer applied to the diodes 182,184, the diodes are turned OFF or to an OFF state (i.e., zero biased). This generally presents a high impedance condition at the ends of the quarter wavelength lines 178, 180 proximate the diodes. Then, at the output ports 160, 162, a low impedance mismatch or "short circuit" condition is presented. If the output ports 160, 162 of the hybrid coupler circuit 156 are terminated with such equal "short circuits," the signals at those ports will be all or mostly reflected back into the hybrid coupler circuit, 156. Signals reflected back into ports 160, 162 will couple coherently to the bypass port or isolated port 166 of the coupler circuit 156. In order to provide a proper match at port 166, regardless of the mode of the output switching circuit or switch 192, an isolator circuit 190, such as a Ferrite isolator, is coupled inline between port 166 and output switch 192. An additional function of the Ferrite isolator is to increase the attenuation from port 172 to port 166 in normal operational mode. This may be necessary to maintain the stability and integrity of the signal. Although the hybrid output ports 160, 162 can be unbalanced with any significant mismatch large enough to produce a reasonably low loss from the input port 164 to the isolated port 166, an open "short circuit" condition on the output ports 160, 162 reduces the possibility of intermodulation created by the amplifier circuits 152, 154. Then, the primary source of any intermodulation would become the performance of the PIN diodes in their OFF state. Additionally, for minimum loss through the coupler 156 in bypass mode, the complex impedance at ports 160, 162 should be as identical as possible.

Alternatively, the lines 160, 162 might be half wavelength lines, and the switching might be utilized to pass the signals out of ports 160, 162 of coupler circuit 156 when the diodes 182, 184 are OFF and out of the bypass port 166 when the diode is ON. This approach would, however, make "zero-bias" bypass mode impossible.

To further streamline circuit 150 of the invention, and to minimize costs, the output of the amplifier circuits is not switched through an "open mismatched hybrid" methodology, as with the inputs to the amplifier circuit. In accordance with one aspect of the present invention, switching circuit 192 may be an inexpensive relay, which is utilized at the output 172 in a standard configuration. Since the gain of the amplifier circuits 152, 154 precedes such a switching circuit 192, the performance requirements of any relay utilized for the switching circuit 192 are not as stringent as they may be at a switching circuit utilized at the input to the amplifier circuits. Accordingly, through operation of switching circuit 192, the overall output 194 of circuit 150 is selected either from the output port 172 or from the bypass or isolator port 166 through the isolator circuit 190. When a bypass is desired, a signal is directed through the bypass port 166 to the output port 194 through switching circuit 192. Utilizing a relay for the switching circuit 192 provides broadband isolation. Furthermore, with such a design, a problematic feedback path is avoided.

Accordingly, the embodiment of FIG. 3 provides a desirable bypass switching function, which is robust, straightforward and not particularly complex, is easily operated, and is relatively inexpensive due to a small number of solid-state parts, such as PIN diodes, utilized in the design.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed:

1. A bypass apparatus for use with an amplifier circuit, the bypass apparatus comprising:

a coupler circuit having an input port for receiving an RF input signal and at least one output port for coupling with an input of an amplifier circuit;

a bypass port of the coupler circuit being coupled to a path to bypass the amplifier circuit;

a switching circuit configured to couple with the output ports of the coupler circuit and having an ON state and an OFF state;

the coupler circuit, with the switching circuit ON, coupling the RF input signal to the at least one output port and, with the switching circuit OFF, coupling the RF input signal to the bypass port.

2. The bypass apparatus of claim 1 wherein said switching circuit comprises a quarter wavelength line coupled to the output port of the coupler circuit.

3. The bypass apparatus of claim 2 wherein the quarter wavelength line presents a high impedance at the output port when the switching circuit is ON and presents a low impedance at the output port when the switching circuit is OFF.

4. The bypass apparatus of claim 2 wherein said switching circuit comprises at least one diode in series with the respective quarter wavelength lines, the conductive state of the diodes determining the ON or OFF state of the switching circuit.

5. The bypass apparatus of claim 4, the diode being biased into a conductive state in the presence of a control bias and being biased into a nonconductive state in the absence of the control bias.

6. The bypass apparatus of claim 5 wherein the diode is a PIN diode.

7. The bypass apparatus of claim 1 wherein the coupler circuit is a 90° hybrid coupler.

8. The bypass apparatus of claim 1 wherein the amplifier circuit includes multiple amplifiers, respective output ports of the coupler circuit being coupled to the multiple amplifiers.

9. The bypass apparatus of claim 1 wherein the coupler circuit has a pair of output ports coupled to a pair of amplifiers, and further comprising a combiner coupler circuit coupled to outputs of the amplifier circuits, the combiner coupler operable for combining the amplifier circuit outputs at an output port of the combiner coupler circuit.

10. The bypass apparatus of claim 9 further comprising an output switch, the combiner coupler output port and the bypass port being coupled to the output switch and selectable by the output switch.

11. The bypass apparatus of claim 1 further comprising an isolator circuit coupled to the bypass port of the coupler circuit.

12. A bypass apparatus for use with an amplifier circuit, the bypass apparatus comprising:

a coupler circuit having an input port for receiving an RF input signal and at least one output port for coupling with an input of an amplifier circuit;

a bypass port of the coupler circuit being coupled to a path to bypass the amplifier circuit;

a switching circuit configured to couple with the output ports of the coupler circuit and having an ON state and an OFF state;

the coupler circuit, with the switching circuit OFF, coupling the RF input signal to the at least one output port and, with the switching circuit ON, coupling the RF input signal to the bypass port.

13. The bypass apparatus of claim 12 wherein said switching circuit comprises a half wavelength line coupled to the output port of the coupler circuit.

14. The bypass apparatus of claim 13 wherein said switching circuit comprises at least one diode in series with the half wavelength lines, the conductive state of the diodes determining the ON or OFF state of the switching circuit.

15. The bypass apparatus of claim 14, the diode being biased into a conductive state in the presence of a control bias and being biased into a nonconductive state in the absence of the control bias.

16. The bypass apparatus of claim 15 wherein the diode is a PIN diode.

17. The bypass apparatus of claim 12 wherein the amplifier circuit includes multiple amplifiers, respective output ports of the coupler circuit being coupled to the multiple amplifiers.

18. The bypass apparatus of claim 12 wherein the coupler circuit has multiple output ports coupled to a pair of amplifiers, and further comprising a combiner coupler circuit coupled to outputs of the amplifier circuits, the combiner coupler operable for combining the amplifier circuit outputs at an output port of the combiner coupler circuit.

19. The bypass apparatus of claim 18 further comprising an output switch, the combiner coupler output port and the bypass port being coupled to the output switch and selectable by the output switch.

20. A method of bypassing an amplifier circuit, the method comprising:

coupling an RF input signal to an input port of a coupler circuit;

coupling at least one output port of the coupler circuit to an input of an amplifier circuit;

coupling, to a bypass port of the coupler circuit, a path to bypass the amplifier circuit;

coupling, to the at least one output port, a switching circuit having an ON state and an OFF state;

with the switching circuit ON, coupling the RF input signal to the at least one output port and, with the switching circuit OFF, coupling the RF input signal to the bypass port.

21. The method of claim 20 wherein said switching circuit comprises a quarter wavelength line coupled to the output port of the coupler circuit.

22. The method of claim 20 further comprising presenting a high impedance at the output port when the switching circuit is ON and presenting a low impedance at the output port when the switching circuit is OFF.

23. The method of claim 21 wherein said switching circuit comprises at least one diode in series with the respective quarter wavelength lines, the method comprising changing the conductive state of the diodes to determine the ON or OFF state of the switching circuit.

24. The method of claim 23 comprising biasing the diode into a conductive state in the presence of a control bias and into a nonconductive state in the absence of the control bias.

25. The method of claim 23 wherein the diode is a PIN diode.

26. The method of claim 20 wherein the coupler circuit is a 90° hybrid coupler.

27. The method of claim 20 wherein the amplifier circuit includes multiple amplifiers, respective output ports of the coupler circuit being coupled to the multiple amplifiers.

28. The method of claim 20 wherein the coupler circuit has a pair of output ports coupled to a pair of amplifiers, and further comprising coupling a combiner coupler circuit to outputs of the amplifier circuits, the combiner coupler operable for combining the amplifier circuit outputs at an output port of the combiner coupler circuit.

29. The method of claim 28 further comprising an output switch having a selectable output, the method comprising coupling the combiner coupler output port and the bypass port to the output switch for selection through the output switch.

* * * * *